United States Patent
Katz et al.

(10) Patent No.: US 9,059,353 B2
(45) Date of Patent: Jun. 16, 2015

(54) OPTOELECTRONIC COMPONENT

(75) Inventors: Simeon Katz, Neutraubling (DE);
Bastian Galler, Regensburg (DE);
Martin Strassburg, Donaustauf (DE);
Matthias Sabathil, Regensburg (DE);
Philipp Drechsel, Regensburg (DE);
Werner Bergbauer, Windberg (DE);
Martin Mandl, Lappersdorf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/240,433

(22) PCT Filed: Aug. 30, 2012

(86) PCT No.: PCT/EP2012/066897
§ 371 (c)(1),
(2), (4) Date: Apr. 17, 2014

(87) PCT Pub. No.: WO2013/034485
PCT Pub. Date: Mar. 14, 2013

(65) Prior Publication Data
US 2014/0286369 A1 Sep. 25, 2014

(30) Foreign Application Priority Data

Sep. 7, 2011 (DE) .......................... 10 2011 112 706

(51) Int. Cl.
*H01L 33/06* (2010.01)
*H01L 33/08* (2010.01)
(Continued)

(52) U.S. Cl.
CPC .............. *H01L 33/06* (2013.01); *H01L 33/08* (2013.01); *H01L 33/42* (2013.01); *H01L 33/24* (2013.01); *H01S 5/34333* (2013.01)

(58) Field of Classification Search
CPC .................. H01L 29/2003; H01L 31/035236; H01L 31/03044; H01L 33/06; H01L 33/0075
USPC .................. 257/40, 91, 98, E27.121, 33.005, 257/33.061, 51.003
See application file for complete search history.

(56) References Cited

U.S. PATENT DOCUMENTS 5,168,069 A * 12/1992 Smith et al. ..................... 438/93
5,332,918 A *  7/1994 Smith et al. .................... 257/431
(Continued)

FOREIGN PATENT DOCUMENTS

CN    1820376         8/2006
DE    699 25 995 T2   6/2006
(Continued)

OTHER PUBLICATIONS

English translation of Taiwanese Notification for the Opinion of Examination dated Aug. 19, 2014 from corresponding Taiwanese Patent Application No. 101132247.
(Continued)

*Primary Examiner* — Michael Lebentritt
(74) *Attorney, Agent, or Firm* — DLA PIper LLP (US)

(57) ABSTRACT

An optoelectronic device having an active layer that includes a multiplicity of structural elements spaced apart from one another laterally, wherein the structural elements each have a quantum well structure including at least one barrier layer composed of $In_{x1}Al_{y1}Ga_{1-x1-y1}N$, wherein $0 \leq x1 \leq 1$, $0 \leq y1 \leq 1$ and $x1+y1 \leq 1$, and at least one quantum well layer composed of $In_{x2}Al_{y2}Ga_{1-x2-y2}N$, wherein $0 \leq x2 \leq 1$, $0 \leq y2 \leq 1$ and $x2+y2 \leq 1$.

16 Claims, 4 Drawing Sheets

(51) Int. Cl.
  *H01L 33/42* (2010.01)
  *H01L 33/24* (2010.01)
  *H01S 5/343* (2006.01)

(56) References Cited

U.S. PATENT DOCUMENTS

| | | | |
|---|---|---|---|
| 5,440,147 A * | 8/1995 | Kazmierski et al. | 257/13 |
| 5,615,143 A * | 3/1997 | MacDonald et al. | 365/112 |
| 5,696,023 A * | 12/1997 | Holonyak et al. | 438/767 |
| 7,580,595 B1 * | 8/2009 | Bimberg et al. | 385/4 |
| 2003/0138983 A1 | 7/2003 | Biwa et al. | |
| 2003/0168666 A1 | 9/2003 | Okuyama et al. | |
| 2005/0230695 A1 | 10/2005 | Takayama | |
| 2006/0208273 A1 | 9/2006 | Kang | |
| 2006/0223211 A1 | 10/2006 | Mishra et al. | |
| 2008/0093610 A1 | 4/2008 | Lee | |
| 2010/0108985 A1 | 5/2010 | Chung et al. | |
| 2010/0244001 A1 * | 9/2010 | Katz et al. | 257/40 |
| 2010/0259184 A1 * | 10/2010 | Kato et al. | 315/291 |
| 2010/0264400 A1 | 10/2010 | Kim | |
| 2011/0103418 A1 * | 5/2011 | Hardy et al. | 372/44.01 |
| 2011/0147702 A1 * | 6/2011 | Tansu et al. | 257/13 |
| 2012/0068192 A1 * | 3/2012 | Kim et al. | 257/76 |
| 2012/0313078 A1 | 12/2012 | Fukui et al. | |

FOREIGN PATENT DOCUMENTS

| | | |
|---|---|---|
| EP | 1 727 216 A2 | 11/2006 |
| JP | 2001-237456 | 8/2001 |
| JP | 2003-218393 | 7/2003 |
| JP | 2007-27298 | 2/2007 |
| JP | 2007-519214 | 7/2007 |
| WO | 2009/009612 A2 | 1/2009 |
| WO | 2011/105397 | 9/2011 |

OTHER PUBLICATIONS

V. Yu. Davydov et al., "Phonon dispersion and Raman scattering in hexagonal GaN and AlN," Physical Review B, vol. 58, No. 19, Nov. 15, 1998, pp. 12 899-12 907.

Fang Qian et al., "Gallium Nitride-Based Nanowire Radial Heterostructures for Nanophotonics," Nano Letters, vol. 4, No. 10, Jul. 24, 2004, pp. 1975-1979.

Fang Qian et al., "Core/Multishell Nanowire Heterostructures as Multicolor, High-Efficiency Light-Emitting Diodes," Nano Letters, vol. 5, No. 11, Aug. 23, 2005, pp. 2287-2291.

Stephen D. Hersee et al., "The Controlled Growth of GaN Nanowires," Nano Letters, vol. 6, No. 8, Mar. 10, 2006, pp. 1808-1811.

K. Kishino et al., "InGaN/GaN Nanocolumn LEDs Emitting from Blue to Red," Proceedings of SPIE, vol. 6473, 2007, pp. 64730T-1-64730T-12.

E. Feltin et al., "Blue lasing at room temperature in an optically pumped lattice-matched AlInN/GaN VCSEL structure," Electronics Letters, vol. 43, No. 17, Aug. 16, 2007.

R. Butté et al., "Current status of AlInN layers lattice-matched to GaN for photonics and electronics," Journal of Physics D: Applied Physics, vol. 40, Oct. 5, 2007, pp. 6328-6344.

Jelena Ristić et al., "On the mechanisms of spontaneous growth of III-nitride nanocolumns by plasma-assisted molecular beam epitaxy," Journal of Crystal Growth, vol. 310, Jun. 12, 2008, pp. 4035-4045.

J. Hader et al., "On the importance of radiative and Auger losses in GaN-based quantum wells," Applies Physics Letters, vol. 92, Jul. 1, 2008, pp. 261103-1-261103-3.

Fang Qian et al., "Multi-quantum-well nanowire heterostructures for wavelength-controlled lasers," Nature Materials, vol. 7, Aug. 17, 2008, pp. 701-706, www.nature.com/naturematerials.

Katsumi Kishino et al., "Improved Ti-mask selective-area growth (SAG) by rf-plasma-assisted molecular beam epitaxy demonstrating extremely uniform GaN nanocolumn arrays," Journal of Crystal Growth, vol. 311, Nov. 21, 2009, pp. 2063-2068.

Suk Choi et al., "Improvement of peak quantum efficiency and efficiency droop in III-nitride visible light-emitting diodes with an InAlN electron-blocking layer," Applies Physics Letters, vol. 96, Jun. 3, 2010, pp. 221105-1-221105-3.

Hiroto Sekiguchi et al., "Emission color control from blue to red with nanocolumn diameter of InGaN/GaN nanocolumn arrays grown on same substrate," Applies Physics Letters, vol. 96, Jun. 7, 2010, pp. 231104-1-231104-3.

Hongping Zhao et al., "Current injection efficiency induced efficiency-droop in InGaN quantum well light-emitting diodes," Solid-State Electronics, vol. 54, Jun. 11, 2010, pp. 1119-1124.

W. Bergbauer et al., "Continuous-flux MOVPE growth of position-controlled N-face GaN nanorods and embedded InGaN quantum wells," Nanotechnology, vol. 21, Jul. 6, 2010, pp. 1-5 (305201.

Po-Yuan Dang et al., "Optical polarization anisotropy of tensile strained InGaN/AlInN quantum wells for TM mode lasers," Journal of Applied Physics, vol. 108, No. 8, Oct. 22, 2010, pp. 83108-1-83108-4.

Meng Zhang et al., "High performance tunnel injection InGaN/GaN quantum Dot light emitting diodes emitting in the green ($\lambda = 495$ nm)," Journal of Crystal Growth, vol. 323, No. 1, Dec. 21, 2010, pp. 470-472.

F. Limbach et al., "Structural and optical properties of InGaN-GaN nanowire heterostructures grown by molecular beam epitaxy," Journal of Applied Physics, vol. 109, Jan. 7, 2011, pp. 014309-1-014309-6.

Emmanouil Kioupakis et al., "Indirect Auger recombination as a cause of efficiency droop in nitride light-emitting diodes," Applied Physics Letters, vol. 98, 2011, pp. 161107-1-161107-3.

W. Bergbauer et al., "N-face GaN nanorods: Continuous-flux MOVPE growth and morphological properties," Journal of Crystal Growth, vol. 315, Aug. 5, 2011, pp. 164-167.

English Translation of Notice of Reasons for Rejection dated Jan. 27, 2015 from corresponding Japanese Application No. 2014-527662.

* cited by examiner

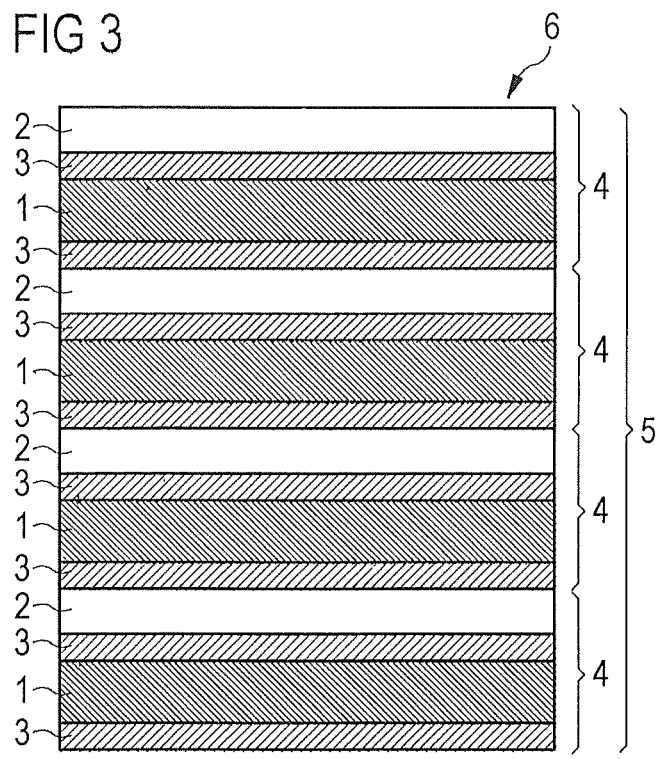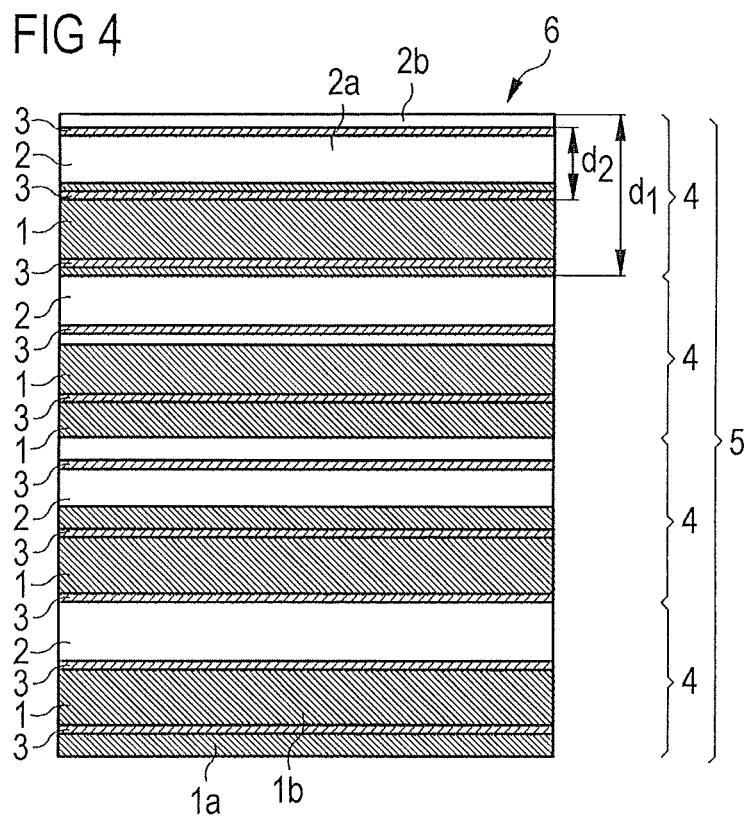

OPTOELECTRONIC COMPONENT

TECHNICAL FIELD

This disclosure relates to an optoelectronic device having an active layer with a quantum well structure that comprises nitride compound semiconductor materials, especially InGaN.

BACKGROUND

Quantum well structures composed of nitride compound semiconductors which especially comprise InGaN are frequently used as an active layer in LEDs or laser diodes which usually emit in the blue spectral range. Depending upon the composition of the semiconductor material, emission in the ultraviolet, green, yellow or red spectral ranges is also possible. Luminescence conversion by luminescent materials enables short-wave radiation to be converted into larger wavelengths. In this way it is possible to generate mixed-colored light, especially white light. LEDs based on nitride compound semiconductors are therefore of considerable importance for LED lighting systems.

It has been found that the efficiency of LEDs having an InGaN-based quantum well structure declines at high current densities (the so-called "droop effect"). This effect is described, for example, in E. Kioupakis et al., "Indirect Auger recombination as a cause of efficiency droop in nitride light-emitting diodes," Applied Physics Letters 98, 161107 (2011). It is assumed that an Auger-like recombination is the dominant loss mechanism in InGaN-based LEDs. That loss mechanism already occurs at current densities appreciably below the customary operating current density and brings about a reduction in the efficiency of the LED. It is assumed that the high Auger-like loss is caused by phonon-assisted Auger recombinations. Such phonon-assisted Auger recombinations occur in particular in InGaN-based semiconductor material. The reason for this is a strong electron/phonon interaction (high Huang-Rhys factor).

J. Ristié et al., "On the mechanisms of spontaneous growth of III-nitride nanocolumns by plasma-assisted molecular beam epitaxy," Journal of Crystal Growth 310 (2008), 4035-4045, describes production of GaN-nanostructures. Further, W. Bergbauer et al., "N-face GaN nanorods: Continuous-flux MOVPE growth and morphological properties," Journal of Crystal Growth 315 (2011), 164-167, describes production of nanostructures composed of GaN. The content of those publications is incorporated herein by reference.

There is nonetheless a need to provide an optoelectronic device having an active layer that comprises a quantum well structure based on a nitride compound semiconductor material, wherein losses caused by phonon-assisted Auger recombinations are reduced. At the same time the optical and electronic properties of the quantum well structure should otherwise be affected as little as possible.

SUMMARY

We provide an optoelectronic device having an active layer that includes a multiplicity of structural elements spaced part from one another laterally, wherein the structural elements each have a quantum well structure including at least one barrier layer composed of $In_{x1}Al_{y1}Ga_{1-x1-y1}N$, wherein $0 \le x1 \le 1$, $0 \le y1 \le 1$ and $x1+y1 \le 1$, and at least one quantum well layer composed of $In_{x2}Al_{y2}Ga_{1-x2-y2}N$, wherein $0 \le x2 \le 1$, $0 \le y2 \le 1$ and $x2+y2 \le 1$.

We also provide an optoelectronic device having an active layer that includes a multiplicity of structural elements laterally spaced apart from one another, wherein the structural elements each have a quantum well structure including at least one barrier layer composed of $In_{x1}Al_{y1}Ga_{1-x1-y1}N$, wherein $0 \le x1 \le 1$, $0 \le y1 \le 1$ and $x1+y1 \le 1$, and at least one quantum well layer composed of $In_{x2}Al_{y2}Ga_{1-x2-y2}N$, wherein $0 \le x2 \le 1$, $0 \le y2 \le 1$ and $x2+y2 \le 1$, the quantum well structure includes a plurality of intermediate layers composed of $In_xAl_{1-x}N$, wherein $0 \le x \le 0.6$, the intermediate layers have a thickness of less than 1.5 nm, and the barrier layers and quantum well layers are interrupted in a vertical direction by the intermediate layers.

BRIEF DESCRIPTION OF THE DRAWINGS

FIG. 3 is a diagrammatic view of a further example of a structural element in the optoelectronic device in accordance with the first example.

FIG. 4 is a diagrammatic view of a further example of a structural element in the optoelectronic device in accordance with the first example.

DETAILED DESCRIPTION

Figure 1:
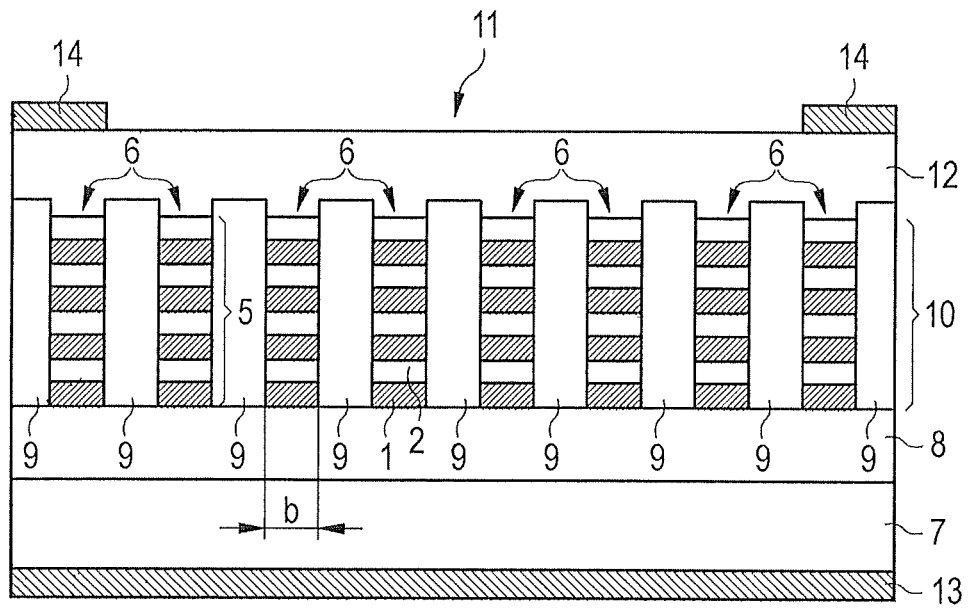
FIG. 1 is a diagrammatic view of a cross-section through an optoelectronic device in accordance with a first example.

We provide a optoelectronic device having an active layer that may comprise a multiplicity of structural elements spaced apart from one another laterally. The optoelectronic device may particularly be a radiation-emitting optoelectronic device, for example, an LED or a semiconductor laser. The structural elements each have a quantum well structure comprising one or more barrier layers composed of $In_{x1}Al_{y1}Ga_{1-x1-y1}N$, wherein $0 \le x1 \le 1$, $0 \le y1 \le 1$ and $x1+y1 \le 1$, and one or more quantum well layers composed of $In_{x2}Al_{y2}Ga_{1-x2-y2}N$, wherein $0 \le x2 \le 1$, $0 \le y2 \le 1$ and $x2+y2 \le 1$. The at least one barrier layer has a larger electronic band gap than the at least one quantum well layer. This can be achieved, for example, by the barrier layer having a smaller indium content than the quantum well layer. Preferably, the following applies in respect of the indium contents: $x1 < 0.7$ and $x2 \le 0.7$.

Because the active layer has a multiplicity of structural elements spaced apart from one another in a lateral direction, that is to say in a direction parallel to the main plane of extent of the active layer, a reduction in the possible phonon emission modes can be achieved, with the result that phonon-assisted Auger recombinations in the quantum well structure are reduced. Reduction in such non-radiating recombinations advantageously results in an increase in efficiency of the optoelectronic device compared to an optoelectronic device in which the quantum well structure is formed from continuous, that is to say uninterrupted in the lateral direction, barrier layers and quantum well layers.

The structural elements are arranged one next to the other in the plane of the active layer. The structural elements are three-dimensional bodies which can preferably have, at least in certain regions, the shape of a cylinder, a parallelepiped, a prism, a pyramid or a truncated pyramid.

Preferably, the structural elements have, at least in certain regions, a shape matched to the hexagonal crystal structure of a nitride compound semiconductor material. In particular, the structural elements can have, at least in certain regions, the shape of a hexagonal pyramid, a truncated hexagonal pyramid or a hexagonal prism.

The structural elements preferably have a width of 20 µm or less. The width of the structural elements is to be understood as being the largest dimension of the structural elements in the lateral direction. By virtue of the small width of the structural elements, the active layer has in the lateral direction a multiplicity of interruptions by which phonons in the semiconductor material are suppressed. Advantageously, the width of the structural elements may be 5 nm to 5 µm. Preferably the width of the structural elements is 20 nm to 1 µm, especially preferably 25 nm to 250 nm.

Also advantageously, a mask layer may be arranged in the optoelectronic device, the structural elements each being arranged in an opening in the mask layer. The mask layer can be, for example, an $SiO_2$ layer or an SiN layer. The structural elements can be produced, for example, by growing the mask layer onto a semiconductor layer of the optoelectronic device and subsequently providing it with a multiplicity of openings. The mask layer can especially be structured photo lithographically.

The openings in the mask layer can, however, also be formed by self-organization, for example, by using a thin, not yet closed layer as the mask layer. For example, a thin Ni layer can be used as a mask.

The structural elements are subsequently grown epitaxially in the openings of the mask layer. In this case, the geometric shape of the structural elements and the distances between the structural elements are determined by the openings in the mask layer.

As an alternative to production of the structural elements with a mask layer, it is also possible to adjust the growth conditions for growth of the active layer such that three-dimensional growth of nanostructures takes place. The nanostructures are advantageously formed by a self-organization process in which a mask layer is not used. The shape of the structures can be influenced by suitable exploitation of lattice-mismatch-induced strains or by the growth conditions, for example, in the case of growth by MOVPE by the composition of the process gas.

Advantageously, the at least one barrier layer and/or the at least one quantum well layer of the quantum well structure can comprise $In_xAl_{1-x}N$ wherein $0 \leq x \leq 0.35$. The barrier layer and/or the quantum well layer may therefore be free of gallium, the indium content x in the ternary $In_xAl_{1-x}N$ semiconductor material being not more than 0.35. Phonons in the semiconductor material may be reduced not only by structuring the active layer to form a multiplicity of laterally spaced structural elements arranged one next to the other, but also by the choice of material of the barrier layers and/or quantum well layers. This has the result, in particular, that gallium-containing nitride compound semiconductor layers are interrupted at regular intervals both in the vertical and lateral directions, with the result that propagation of phonons involved in loss processes is reduced especially efficiently.

Especially preferably, the following applies with respect to the indium content x in the barrier layer and/or the quantum well layer: $0.09 \leq x \leq 0.27$. We found that it is particularly in this indium content range that the LO phonon modes are greatly reduced.

Further advantageously, the quantum well structure may comprise a plurality of intermediate layers composed of $In_xAl_{1-x}N$ wherein $0 \leq x \leq 0.6$. The barrier layers can comprise, for example, $In_yGa_{1-y}N$, wherein $0 \leq y < 1$, and the quantum well layers can comprise $In_zGa_{1-z}N$, wherein $0 < z \leq 1$ and $z > y$. The barrier layers and quantum well layers may be interrupted in the vertical direction by the intermediate layers.

Preferably, the following applies with respect to indium content in the intermediate layers: $x \leq 0.35$, especially preferably $0.09 \leq x \leq 0.27$. The phonon spectrum can especially be influenced by a variation in the indium content x of the material $Al_{1-x}In_xN$ of the intermediate layer. Preferably, the following applies: $0 \leq x \leq 0.35$.

Especially preferably, the indium content x of the intermediate layers is $0.09 \leq x \leq 0.27$. We found that it is particularly in this indium content range that the LO phonon modes are greatly reduced. By embedding the at least one intermediate layer composed of $Al_{1-x}In_xN$ wherein $0.09 \leq x \leq 0.27$, phonon-assisted recombinations in the quantum well structure can therefore be reduced especially effectively. For example, x can be 0.18.

Preferably, the intermediate layers have a thickness of less than 1.5 nm. In this way, it is advantageously possible to modify the phonon spectrum in the region of the quantum well structure such that non-radiating recombinations are reduced while, on the other hand, the optical and electronic properties of the quantum well structure are otherwise modified only negligibly.

The at least one intermediate layer may be arranged between the barrier layer and the quantum well layer. In the case of a multiple quantum well structure, the intermediate layers can, for example, each have been inserted at the interface at which, in the direction of growth, a quantum well layer follows a barrier layer. Alternatively, it is also possible for the intermediate layers each to have been inserted at the interface at which, in the direction of growth, a barrier layer follows a quantum well layer.

The indium content x of the at least one intermediate layer is preferably adjusted such that the electronic band gap of the intermediate layer is the same as the electronic band gap of an adjacent barrier layer. Further advantageously, the indium content x of the at least one intermediate layer may be adjusted such that the electronic band gap of the intermediate layer is the same as the electronic band gap of an adjacent quantum well layer. Matching the electronic band gap of the intermediate layer to the barrier layer or to the quantum well layer has the advantageous result that the at least one intermediate layer has only a negligible effect on the electrical properties of the quantum well structure.

Advantageously, the quantum well structure may be a multiple quantum well structure having a plurality of periods each composed of three layers, the three layers being the barrier layer, the intermediate layer and the quantum well layer.

Alternatively, the quantum well structure may be a multiple quantum well structure having a plurality of periods each composed of four layers, the four layers being the intermediate layer, the barrier layer, a further intermediate layer and the quantum well layer. The barrier layer may be enclosed on both sides by the intermediate layers. The further intermediate layer has the same properties and advantages as the intermediate layer previously described.

The quantum well structure may be a multiple quantum well structure in which the barrier layer and the quantum well layer are repeated a number of times with a first period length. Advantageously, a plurality of intermediate layers are embedded in the quantum well structure. The intermediate layers are advantageously repeated a number of times with a second period length, the first period length not being the same as the second period length. In this case, the intermediate layers are therefore not each arranged exactly at an interface between the barrier layer and the quantum well layer, but are distributed in the quantum well structure with a second period length which is not the same as the first period length of the quantum well structure.

The second period length is preferably smaller than the first period length. It is in this way ensured that at least one intermediate layer is embedded in each layer pair composed of a barrier layer and a quantum well layer. The first period length, that is to say the period length of the quantum well structure, is preferably 2 nm to 20 nm. The second period length with which the intermediate layers are repeated is preferably 0.7 nm to 4 nm.

The intermediate layers need not necessarily be arranged periodically, but can, for example, also be distributed non-periodically in the quantum well structure at preferred intervals of 0.7 nm to 4 nm.

The thickness of the at least one barrier layer in the quantum well structure is preferably 0.7 nm to 3 nm. The at least one quantum well layer in the quantum well structure preferably has a thickness of 1 nm to 20 nm, especially preferably 1.5 nm to 12 nm.

Preferably, the structural elements each have a layer stack that contains the quantum well structure, the layers of the layer stack being arranged one above the other such that they do not overlap in the lateral direction. In other words, the layers in the structural elements are arranged one above the other such that each layer arranged above an underlying layer covers the top face but not the side faces of the underlying layer. This can be achieved, for example, by growing the layer stacks forming the structural elements in the openings of a mask layer, the mask layer having a greater thickness than the layer stack. In particular, it is possible for the mask layer used to grow the structural elements to remain in the finished optoelectronic device and in that way the structural elements that are spaced apart from one another laterally can be electrically insulated from one another.

Preferably, an electrically insulating layer is arranged between the structural elements spaced apart from one another laterally. By the electrically insulating layer, in particular short-circuits at the side flanks of the quantum well structures are prevented. The electrically insulating layer can especially be a mask layer used to grow the structural elements.

Advantageously, the structural elements each may have a layer stack that contains the quantum well structure, the layers of the layer stack being arranged one above the other such that a layer of the layer stack arranged above an underlying layer entirely covers the underlying layer including the side flanks thereof. In other words, the structural elements may have a core-shell structure. Since the layers of the quantum well structure arranged one above the other each cover one another entirely, it is advantageously unnecessary to arrange an electrically insulating layer between the structural elements to prevent short-circuits at the side flanks of the structural elements.

Further advantageously, a semiconductor layer and/or a layer composed of a transparent conductive oxide may be applied to the active layer, the semiconductor layer and/or the layer composed of the transparent conductive oxide forming a common electrical contact for the multiplicity of structural elements. The multiplicity of structural elements of the active layer are therefore electrically contacted in common. The second electrical contact for the multiplicity of structural elements can be formed, for example, by a semiconductor layer arranged below the active layer and which electrically connects, for example, by way of a rear side of the substrate.

Our devices and methods are described in detail below with reference to examples in conjunction with FIGS. 1 to 6.

In the Figures, parts that are identical or have identical action are in each case denoted by identical reference numerals. The parts illustrated and the relative sizes of the parts to one another should not be regarded as to scale.

The example of an optoelectronic device 11 shown diagrammatically in FIG. 1 is an LED having a radiation-emitting active layer 10. The active layer 10 of the optoelectronic device 11 is intended to emit radiation, especially in the ultraviolet, blue or green spectral range.

The active layer 10 is arranged between a first cladding layer 8 and a second cladding layer 12. The first cladding layer 8 can be a semiconductor layer or a semiconductor layer sequence which has preferably been grown epitaxially on a substrate 7. The optoelectronic device 11 can have, for example, a substrate 7 composed of GaN, sapphire or Si.

The second cladding layer 12 is arranged above the active layer 10 and preferably comprises a transparent conductive oxide (TCO). In particular, the second cladding layer 12 can be a layer of indium tin oxide (ITO). The surface of the second cladding layer 12 opposite the substrate 7 serves as radiation exit face of the LED. For electrical contacting, for example, a first electrical contact 13 is provided on the rear side of the substrate 7 and a second electrical contact 14 is provided on the surface of the second cladding layer 12.

Alternatively, it is also possible for the second cladding layer 12 to be a semiconductor layer. In that case, the cladding layers 8, 12 advantageously have different types of conductivity. For example, the first cladding layer 8 can be n-doped and the second cladding layer 12 p-doped. The first cladding layer 8 and the second cladding layer 12 can each be composed of a plurality of sub-layers which, for the sake of clarity, are not shown individually in the drawing.

The optoelectronic device 11 need not necessarily have the structure shown by way of example. For example, the optoelectronic device 11 can alternatively be a so-called "thin-film LED" in which the growth substrate 7 used to grow the semiconductor layer sequence has been detached from the semiconductor layer sequence and the semiconductor layer sequence has been joined to a carrier on a side opposite the original growth substrate. In such a thin-film LED a first cladding layer facing the carrier is usually p-doped and a second cladding layer facing the radiation exit face n-doped.

The semiconductor layer sequence of the optoelectronic device 11 is based on a nitride compound semiconductor. "Based on a nitride compound semiconductor" means that the semiconductor layer sequence or at least one layer thereof comprises a III nitride compound semiconductor material, preferably $In_xAl_yGa_{1-x-y}N$, where $0 \leq x \leq 1$, $0 \leq y \leq 1$ and $x+y \leq 1$. Such a material need not necessarily have a mathematically exact composition in accordance with the above formula, but rather it may comprise one or more dopants and additional constituents that do not significantly alter the characteristic physical properties of the $In_xAl_yGa_{1-x-y}N$ material. For the sake of simplicity, however, the above formula contains only the main constituents of the crystal lattice (In, Al, Ga, N), although some of those constituents can be replaced by small amounts of further substances.

The active layer 10 of the optoelectronic device 11 advantageously comprises a multiplicity of structural elements 6 laterally spaced apart from one another, each of which has a quantum well structure 5. The structural elements 6 each have a quantum well structure 5 comprising at least one barrier layer 2 composed of $In_{x1}Al_{y1}Ga_{1-x1-y1}N$, wherein $0 \leq x1 \leq 1$, $0 \leq y1 \leq 1$ and $x1+y1 \leq 1$, and at least one quantum well layer 1 composed of $In_{x2}Al_{y2}Ga_{1-x2-y2}N$, wherein $0 \leq x2 \leq 1$, $0 \leq y2 \leq 1$ and $x2+y2 \leq 1$. The at least one barrier layer 2 has, for example, as a result of a smaller indium content, a larger electronic band gap than the at least one quantum well layer 1. Preferably, the following applies with respect to the indium contents: $x1 < 0.7$ and $x2 \leq 0.7$.

The structural elements 6 of the active layer 10 laterally spaced apart from one another are, for example, in the shape of cylinders. Alternatively, the structural elements 6 can be, for example, in the shape of a cuboid, a prism, a pyramid or a truncated pyramid. Each of the structural elements 6 has a layer stack containing the quantum well structure 5, the layers of the layer stack being arranged one above the other such that they do not overlap in the lateral direction. That is to say, that layers in each case cover the top face, but not the side faces of the underlying layer.

The structural elements 6 can be produced, for example, by alternately growing quantum well layers 1 and barrier layers 2, which form the quantum well structure 5, in the openings of a mask layer 9. For example, prior to growth of the quantum well structure 5, the mask layer 9 is grown onto the first cladding layer 8 arranged below the active layer 10 and provided with a multiplicity of openings. The openings in the mask layer 9 can be made, for example, by photolithography. The mask layer 9 is preferably an electrically insulating layer, especially a layer composed of a silicon oxide or a silicon nitride.

We found that by structuring the active layer 10 to form a multiplicity of structural elements 6 laterally spaced apart from one another, it is possible to achieve an improvement in the efficiency of the optoelectronic device 11. In particular, structuring the active layer 10 brings about a reduction in the phonon density of states in the semiconductor material, with the result that non-radiating phonon-assisted Auger recombinations are reduced.

In the example, the mask layer 9 advantageously is of greater height than the quantum well structures 5 grown in the openings in the mask layer 9. Regions of the electrically insulating mask layer 9 are therefore arranged between the structural elements 6 spaced apart from one another in the lateral direction. This has the advantage that a common electrical contact for the multiplicity of structural elements 6 can be provided by the second cladding layer 12 which is applied over the entire surface of the structured active layer 10. Because, in particular, the side flanks of the structural elements 6 are covered by the electrically insulating mask layer 9, the second cladding layer 12 in each case adjoins only the uppermost semiconductor layer of the quantum well structures 5. On the opposite side, the quantum well structures 5 are contacted by the first cladding layer 8.

The structural elements 6 preferably have a width b of 20 μm or less. In particular, the structural elements can have a width of 5 nm to 5 μm. The width b is preferably 20 nm to 1 μm, especially preferably 25 nm to 250 nm.

Figure 2:
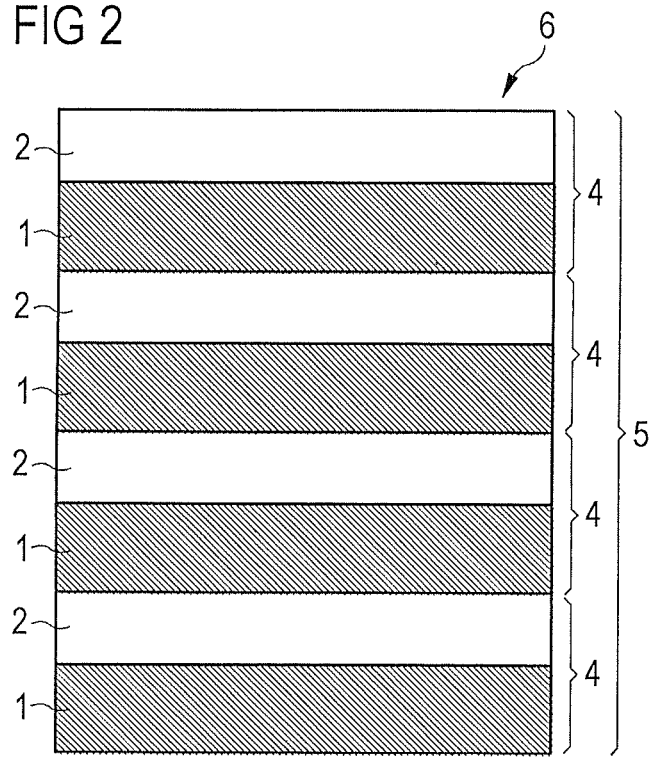
FIG. 2 is a diagrammatic view of an example of a structural element in the optoelectronic device in accordance with the first example.

A structural element 6 of the active layer 10 is shown on an enlarged scale in FIG. 2. The structural element 6 contains a quantum well structure 5 which has alternating quantum well layers 1 and barrier layers 2. In the example, the quantum well structure 5 is a multiple quantum well structure containing four periods 4 each composed of the quantum well layer 1 and the barrier layer 2. The quantum well structure 5 can alternatively also have a different number of periods, for example, between one and one hundred. In particular, it is possible for the quantum well structure 5 to be a single quantum well structure having only one period. Preferably, the number of periods 4 is four to seven. Each period 4 of the quantum well structure 5 has, for example, a thickness of 4 nm to 10 nm.

We advantageously found that the phonon density of states in the semiconductor material that has already been reduced by the structuring of the active layer 10 can be reduced even further if the barrier layers 2 and/or the quantum well layers 1 comprise $In_xAl_{1-x}N$, wherein $0 \leq x \leq 0.35$. Advantageously, the barrier layers 2 and/or the quantum well layers 1 may therefore be in particular free of gallium. Especially preferably the following applies: $0.09 \leq x \leq 0.27$.

An alternative to structural element 6 of the active layer 10 is shown in FIG. 3. In this case, intermediate layers 3 composed of $In_xAl_{1-x}N$, wherein $0 \leq x \leq 0.35$ are present between the barrier layers 2 and the quantum well layers 1. The intermediate layers 3 preferably have a thickness of less than 1.5 nm, especially preferably less than 1 nm. The intermediate layers 3 may be arranged at all interfaces between the barrier layers 2 and quantum well layers 1. Each period 4 of the quantum well structure therefore may consist of 4 layers.

Alternatively, however, it is also possible to arrange the intermediate layers only at those interfaces at which, in the direction of growth, a barrier layer 2 follows a quantum well layer 1. Furthermore, it is possible to arrange the intermediate layers 3 only at those interfaces at which, in the direction of growth, a quantum well layer 1 follows a barrier layer 2. In such case, a period 4 of the quantum well structure 5 in each case consists of 3 layers.

The intermediate layers 3 arranged in the quantum well structure 5 between the quantum well layers 1 and the barrier layers 2 advantageously bring about an increase in efficiency of radiation generation. This results, in particular, from the fact that non-radiating recombinations of charge carriers in the quantum well structure 5, which are phonon-assisted Auger recombinations, are reduced. In particular, we found that insertion of the intermediate layers 3 composed of $In_xAl_{1-x}N$ brings about a reduction in the LO phonon density of states in the quantum well structure 5. This advantageous effect is especially marked if the indium content x of the intermediate layers 3 is 0.09 to 0.27. For example, the intermediate layers can comprise $In_{0.18}Al_{0.82}N$.

In particular, insertion of the intermediate layers 3 increases quantum efficiency of the quantum well structure 5 when the optoelectronic device 11 is driven at high current strengths. Furthermore, we found that insertion of the intermediate layers 3 is able to reduce strains in the semiconductor material. This results in an improvement in crystal quality, which brings about an increase in quantum efficiency, especially in the case of comparatively small current strengths.

The lattice constant of the intermediate layers 3 can be varied by modifying the indium content x so that a lattice match with an adjacent quantum well layer 1 or the neighboring barrier layer 2 can be achieved. By suitably adjusting the indium content x of the intermediate layers 3 it is advantageously possible, alternatively or in addition, for the electronic band gap of the intermediate layer 3 to be matched to an adjacent barrier layer 2 or quantum well layer 1.

FIG. 4 shows a further example of a structural element 6 of the active layer. A plurality of intermediate layers 3 composed of $Al_{1-x}In_xN$ wherein $0 \leq x \leq 0.6$ are embedded in the multiple quantum well structure 5. Unlike the example of FIG. 3, the intermediate layers 3 are embedded in the quantum well structure 5 in a periodic sequence, the period length $d_2$ of the arrangement of the intermediate layers 3 not corresponding to the period length $d_1$ of the quantum well structure 5. In other words, the sequence of quantum well layers 1 and barrier layers 2 has a first period length $d_1$ and the sequence of the intermediate layers 3 has a second period length $d_2$, where $d_1 \neq d_2$.

This has the result that the intermediate layers 3 are not necessarily each arranged at an interface between a quantum well layer 1 and a barrier layer 2, but rather the intermediate layers 3 can also be embedded in a quantum well layer 1 or a barrier layer 2. In that case the intermediate layer 3 is therefore enclosed by a first sub-layer and a second sub-layer of the quantum well layer 1 or barrier layer 2 in question. For example, the first quantum well layer 1 of the lowermost period 4 in the direction of growth has a first sub-layer 1a and a second sub-layer 1b, with an intermediate layer 3 being arranged between the first sub-layer 1a and the second sub-layer 1b. Furthermore, one or even two intermediate layers are embedded in some of the further quantum well layers 1 and barrier layers 2. The uppermost period 4 of the quantum well structure 5 in the direction of growth has, for example, a barrier layer 2 having a first sub-layer 2a and a second sub-layer 2b, with an intermediate layer 3 being arranged between the first sub-layer 2a and the second sub-layer 2b.

Furthermore, it can also be the case that at least some of the intermediate layers 3 are arranged at an interface between a quantum well layer 1 and a barrier layer 2. For example, the barrier layer 2 of the lowermost period 4 in the direction of growth adjoins an intermediate layer 3 on both sides.

The intermediate layers 3 may be advantageously comparatively thin. Preferably, the thickness of the intermediate layers 3 is less than 1 nm, especially preferably less than 0.5 nm.

The period length $d_2$ of the intermediate layers 3 is preferably 2 nm to 4 nm. Preferably, the period length $d_2$ of the intermediate layers 3 is smaller than the period length $d_1$ of the multiple quantum well structure 5. In that way it is ensured that at least one intermediate layer 3 is embedded in each period 4 of the quantum well structure 5. The period of the quantum well structure 5 can be, for example, 4 nm to 10 nm.

Especially preferably, the indium content x of the intermediate layers 3 is in each case adjusted such that the electronic band gap of the intermediate layer 3 is matched to the material of the quantum well layer 1 or the barrier layer 2 in which the intermediate layer 3 in question is embedded. In the case of an intermediate layer 3 arranged at an interface between a quantum well layer 1 and a barrier layer 2, the indium content x of the intermediate layer 3 is preferably adjusted such that the electronic band gap of the intermediate layer 3 corresponds either to the adjacent quantum well layer 1 or to the adjacent barrier layer 2. In this way, the electronic properties of the quantum well structure 5 are advantageously not significantly affected by embedding of the intermediate layers 3. In this way, therefore, undesired phonons in the semiconductor material, which could reduce the efficiency of the optoelectronic device 11 by non-radiating recombinations, are advantageously reduced, but at the same time the other electronic and optical properties of the optoelectronic device 11 are only insignificantly modified.

Figure 5A:
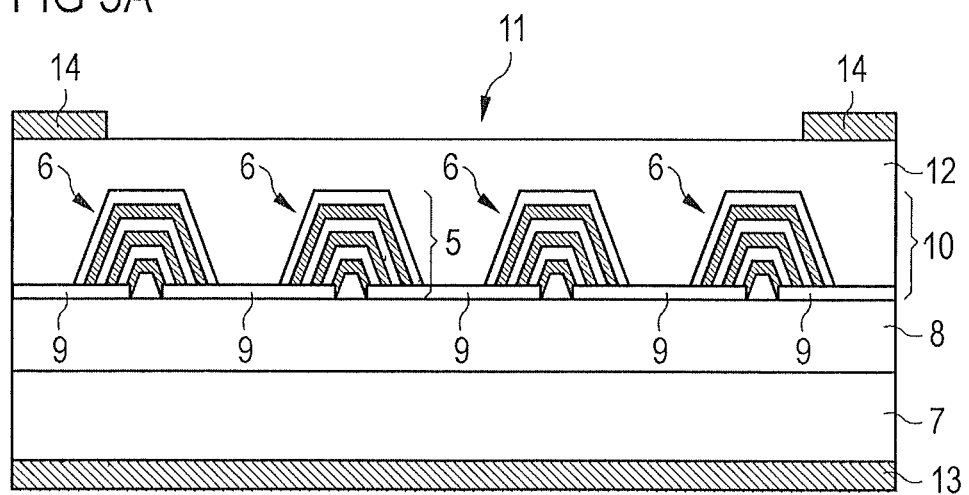
FIG. 5A is a diagrammatic view of a cross-section through an optoelectronic device in accordance with a second example.

The second example of an optoelectronic device 11 shown in FIG. 5A differs from the first example in the configuration of the structural elements 6 of the active layer 10. As in the first example, the active layer 10 has a multiplicity of structural elements 6 arranged one next to the other, the structural elements 6 each having a quantum well structure 5.

Figure 5B:
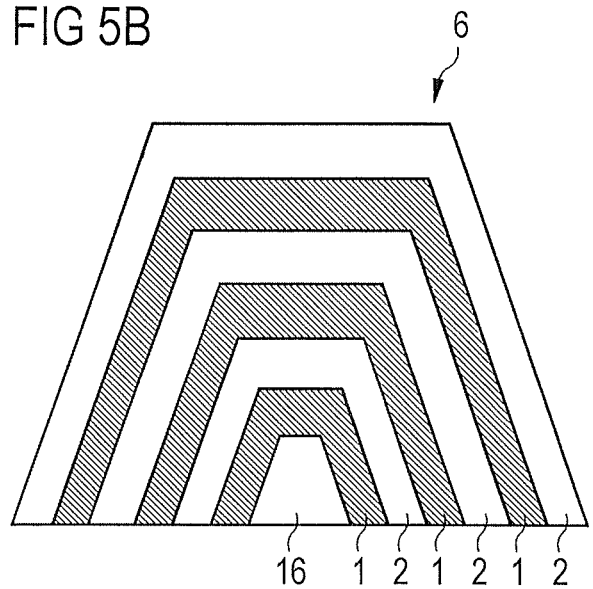
FIG. 5B is a diagrammatic view of an example of a structural element in the optoelectronic device in accordance with the second example.

A single structural element 6 of the active layer 10 is shown on an enlarged scale in FIG. 5B. The quantum well structure 5 has a multiplicity of alternating quantum well layers 1 and barrier layers 2. Unlike the first example, the layers 1, 2 in the layer stack forming the quantum well structure are arranged such that a layer of the layer stack arranged above an underlying layer in each case entirely covers the underlying layer including the side flanks thereof. In other words, the structural element 6 has a core-shell structure. A core layer 16, which forms the core of the structural element 16, may have the shape of a truncated pyramid. Alternatively, the core layer 16 can, however, also have some other shape. The core layer 16 can comprise, for example, GaN. In particular, the core layer 16 can be formed from the material of the barrier layers 2 of the quantum well structure.

The subsequent quantum well layer 1 entirely covers the core layer 16 including the side flanks thereof. In the same way, the subsequent alternating quantum well layers 1 and barrier layers 2 each entirely cover the underlying layer including the side flanks thereof.

It is in particular unnecessary for the mask layer 9 to have a greater height than the quantum well structures 5. The second cladding layer 12, especially a transparent conductive oxide, such as, for example, ITO, can be applied over the entire surface of the multiplicity of structural elements 6 without there being any risk of a short-circuit at the side flanks of the quantum well structures 5. This is because the uppermost layer of the quantum well structure 5 entirely covers the underlying layers. The second cladding layer 12 is therefore in electrical contact only with the uppermost layer of the quantum well structure 5, even when there is no electrical insulating layer arranged between the structural elements 6.

In the second example, as in the first example, the quantum well structure 5 can be configured with intermediate layers between the barrier layers 2 and quantum well layers 1 or, for example, with intermediate layers distributed periodically in the quantum well structure 5 (not shown). Further advantageous examples of the second example of the optoelectronic device 11 correspond to the first example described above.

Figure 6A:
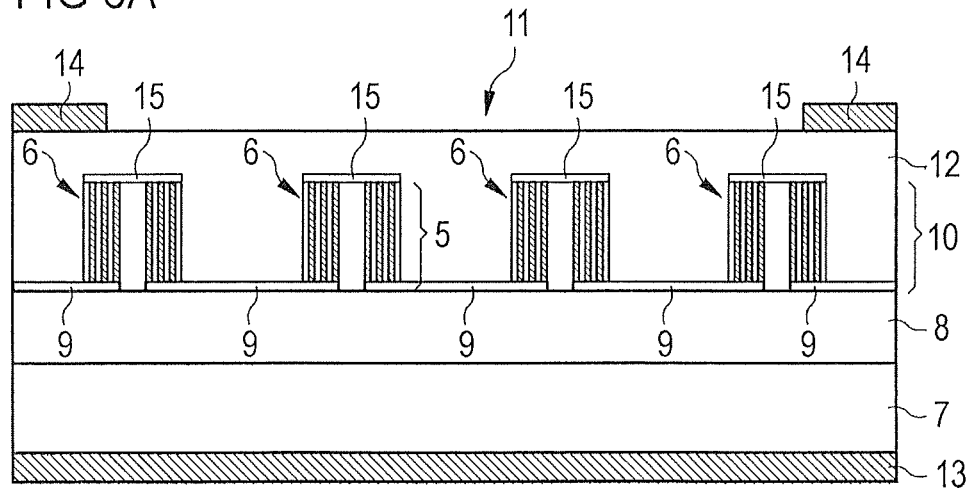
FIG. 6A is a diagrammatic view of a cross-section through an optoelectronic device in accordance with a third example.
Figure 6B:
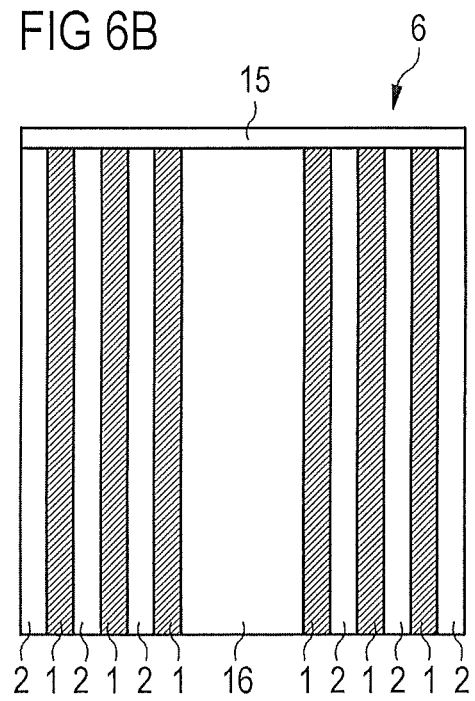
FIG. 6B is a diagrammatic view of an example of a structural element in the optoelectronic device in accordance with the third example.

FIG. 6A shows a third example of the optoelectronic device 11 which differs from the previous examples in the configuration of the structural elements 6 of the active layer 10. A single structural element 6 is shown on an enlarged scale in FIG. 6B.

The structural elements 6 each have a core layer 16 which has, for example, substantially the shape of a cylinder or a hexagonal prism. A substantially hexagonal shape can especially be determined by the hexagonal crystal structure of the nitride compound semiconductor material. The quantum well structure 5 of the structural elements 6 formed from alternating quantum well layers 1 and barrier layers 2 is in each case grown on the side faces of the core layer 16. The main planes of the quantum well layers 1 and barrier layers 2 are arranged substantially perpendicular to the substrate 7.

A top face of the structural elements 6 is covered by an electrically insulating layer 15. With the electrically insulating layer 15, in particular the side faces of the quantum well layers 1 and barrier layers 2 running in the horizontal direction are electrically insulated from the second cladding layer 12. The structural elements 6 electrically contact the second cladding layer 12, which comprises, for example, a transparent conductive oxide, on their outer face but not on their top face.

Further advantages of the third example of the optoelectronic device 11 will be found in the description of the examples described above.

The description of our devices and methods with reference to the examples does not limit those devices and methods thereto, but rather this disclosure encompasses any novel feature and any combination of features, including in particular any combination of features in the appended claims, even if the features or combinations are not themselves explicitly defined in the claims or examples.

The invention claimed is:

1. An optoelectronic device having an active layer comprising a multiplicity of structural elements laterally spaced apart from one another, wherein the structural elements each have a quantum well structure comprising at least one barrier layer composed of $In_{x1}Al_{y1}Ga_{1-x1-y1}N$, wherein $0 \leq x1 \leq 1$, $0 \leq y1 \leq 1$ and $x1+y1 \leq 1$, a plurality of intermediate layers composed of $In_xAl_{1-x}N$, wherein $0 \leq x \leq 0.6$, and at least one quantum well layer composed of $In_{x2}Al_{y2}Ga_{1-x2-y2}N$, wherein $0 \leq x2 \leq 1$, $0 \leq y2 \leq 1$ and $x2+y2 \leq 1$, wherein the quantum well structure is a multiple quantum well structure in which the barrier layer and the quantum well layer are repeated a number of times with a first period length and the intermediate layers are repeated a number of times with a second period length, the first period length not being the same as the second period length.

2. The optoelectronic device according to claim 1, wherein indium content x of the intermediate layers is $0.09 \leq x \leq 0.27$.

3. The optoelectronic device according to claim 1, wherein the intermediate layers have a thickness of less than 1.5 nm.

4. The optoelectronic device according to claim 1, wherein the structural elements have, at least in certain regions, a shape of a cylinder, a cuboid, a prism, a pyramid or a truncated pyramid.

5. The optoelectronic device according to claim 1, wherein the structural elements have, at least in certain regions, a shape of a hexagonal pyramid, a truncated hexagonal pyramid or a hexagonal prism.

6. The optoelectronic device according to claim 1, wherein the structural elements have a width of 20 μm or less.

7. The optoelectronic device according to claim 1, wherein the structural elements have a width of 5 nm to 5 μm.

8. The optoelectronic device according to claim 1, further comprising a mask layer arranged in the optoelectronic device, and wherein the structural elements are each arranged in an opening in the mask layer.

9. The optoelectronic device according to claim 1, wherein the at least one barrier layer and/or the at least one quantum well layer comprise $In_xAl_{1-x}N$, wherein $0 \leq x \leq 0.35$.

10. The optoelectronic device according to claim 9, wherein indium content x of the barrier layer and/or the quantum well layer is $0.09 \leq x \leq 0.27$.

11. The optoelectronic device according to claim 1, wherein the structural elements each have a layer stack that contains the quantum well structure, and layers of a layer stack are arranged one above the other such that they do not overlap in a lateral direction.

12. The optoelectronic device according to claim 11, further comprising an electrically insulating layer arranged between the structural elements that are laterally spaced apart from one another.

13. The optoelectronic device according to claim 1, wherein the structural elements each have a layer stack that contains the quantum well structure, the layers of the layer stack being arranged one above the other such that a layer of the layer stack arranged above an underlying layer entirely covers the underlying layer including side flanks thereof.

14. The optoelectronic device according to claim 1, further comprising a layer composed of a transparent conductive oxide applied to the active layer, the layer composed of the transparent conductive oxide forming a common electrical contact for the multiplicity of structural elements.

15. An optoelectronic device having an active layer that comprises a multiplicity of structural elements laterally spaced apart from one another, wherein the structural elements each have a quantum well structure comprising at least one barrier layer composed of $In_{x1}Al_{y1}Ga_{1-x1-y1}N$, wherein $0 \leq x1 \leq 1$, $0 \leq y1 \leq 1$ and $x1+y1 \leq 1$, and at least one quantum well layer composed of $In_{x2}Al_{y2}Ga_{1-x2-y2}N$, wherein $0 \leq x2 \leq 1$, $0 \leq y2 \leq 1$ and $x2+y2 \leq 1$, the quantum well structure comprises a plurality of intermediate layers composed of $In_xAl_{1-x}N$, wherein $0 \leq x \leq 0.6$, the intermediate layers have a thickness of less than 1.5 nn and are distributed non-periodically in the quantum well structure, and the barrier layers and quantum well layers are interrupted in a vertical direction by the intermediate layers.

16. The optoelectronic device according to claim 1, wherein the second period length is smaller than the first period length.

* * * * *